United States Patent
Nishikawa et al.

(10) Patent No.: US 6,890,605 B2
(45) Date of Patent: May 10, 2005

(54) METHOD OF FILM FORMATION, INSULATING FILM, AND SUBSTRATE FOR SEMICONDUCTOR

(75) Inventors: Michinori Nishikawa, Mie (JP); Manabu Sekiguchi, Ibaraki (JP); Matthias Patz, Heverlee (BE); Mutsuhiko Yoshioka, Ibaraki (JP); Atsushi Shiota, Ibaraki (JP); Kinji Yamada, Ibaraki (JP)

(73) Assignee: JSR Corporation, Tokyo (JP)

(*) Notice: Subject to any disclaimer, the term of this patent is extended or adjusted under 35 U.S.C. 154(b) by 0 days.

(21) Appl. No.: 10/252,607

(22) Filed: Sep. 24, 2002

(65) Prior Publication Data

US 2003/0059550 A1 Mar. 27, 2003

(30) Foreign Application Priority Data

Sep. 25, 2001 (JP) ........................... 2001-291539
Oct. 3, 2001 (JP) ........................... 2001-307909

(51) Int. Cl.⁷ ............... B05D 3/04; B05D 3/06; H05H 1/00
(52) U.S. Cl. ............... 427/539; 427/96; 427/299; 427/532; 427/535; 427/553; 427/557; 427/558
(58) Field of Search ............... 427/299, 301, 427/302, 532, 533, 535, 539, 553, 557, 558, 96; 428/446, 447, 448

(56) References Cited

U.S. PATENT DOCUMENTS 6,051,310 A * 4/2000 Cano et al. ............... 428/336
6,346,331 B2 * 2/2002 Harvey et al. ............... 428/429
6,448,331 B1 * 9/2002 Ioka et al. ............... 524/859

OTHER PUBLICATIONS

U.S. Appl. No. 10/252,607, filed Sep. 24, 2002, Nishikawa, et al.
U.S. Appl. No. 10/270,066, filed Oct. 15, 2002, Shiota, et al.
U.S. Appl. No. 10/307,384, filed Dec. 2, 2002, Shiota, et al.

* cited by examiner

Primary Examiner—Michael J. Feely
(74) Attorney, Agent, or Firm—Oblon, Spivak, McClelland, Maier & Neustadt, P.C.

(57) ABSTRACT

An insulating film for semiconductors which has excellent adhesion to films formed by CVD and is useful as a dielectric film in semiconductor devices and the like is provided. The insulating film is obtained by a method comprising:

(A) a step of subjecting a substrate to at least either of (A-1) at least one treatment selected from the group consisting of an ultraviolet irradiation treatment, an oxygen plasma treatment, a nitrogen plasma treatment, a helium plasma treatment, an argon plasma treatment, a hydrogen plasma treatment and an ammonia plasma treatment, and (A-2) a treatment with at least one of alkoxysilane compound having a reactive group and a product of the hydrolysis and condensation thereof; and (B) a step of applying a composition for film formation which comprises an organic solvent and either or both of at least one compound selected from the group consisting of compounds represented by the general formulae (1) to (4) as described hereinabove, and a hydrolysis/condensation product obtained by hydrolyzing and condensing the at least one compound, to the substrate and heating the resulting coating.

16 Claims, No Drawings

METHOD OF FILM FORMATION, INSULATING FILM, AND SUBSTRATE FOR SEMICONDUCTOR

FIELD OF THE INVENTION

The present invention relates to a method of film formation. More particularly, the invention relates to an insulating film for semiconductors by the method of film formation, which has excellent adhesion between constituent layers including a coating film formed by CVD and is useful in the production of semiconductor devices or the like.

DESCRIPTION OF THE RELATED ART

Silica ($SiO_2$) films formed by vacuum processes such as CVD have hitherto been used frequently as dielectric films in semiconductor devices and other devices. In recent years, an insulating film formed from a coating fluid has come to be used for the purpose of forming a more even dielectric film. This film, which is called an SOG (spin on glass) film, comprises a tetraalkoxysilane hydrolyzate as the main component. Furthermore, as a result of the trend toward higher degree of integration in semiconductor devices and the like, a dielectric film called an organic SOG film has been developed which comprises a polyorganosiloxane as the main component and has a low dielectric constant.

In particular, with further progress in the degree of integration or multilayer constitution in semiconductor devices and the like, a dielectric film material having a lower dielectric constant, preferably 2.5 or below, and having excellent adhesion to the substrate has come to be desired.

As materials attaining a low dielectric constant, a composition comprising a mixture of fine particles obtained by condensing an alkoxysilane in the presence of ammonia and a basic product of partial hydrolysis of an alkoxysilane (see Japanese Patent Laid-Open Nos. 5-263045 and 5-315319) and a coating fluid obtained by condensing a basic hydrolyzate of a polyalkoxysilane in the presence of ammonia (see Japanese Patent Laid-Open Nos. 11-340219 and 11-340220) are proposed. However, the materials obtained by these methods have had a problem that the insulating films themselves have poor adhesion to the substrate or have a dielectric constant exceeding 2.5.

SUMMARY OF THE INVENTION

An object of the invention is to provide a method of film formation which eliminates the problem described above. More particularly, the object is to provide an insulating film for semiconductors which has excellent adhesion to films formed by CVD and is useful as a dielectric film in semiconductor devices and the like.

The invention provides a method of film formation which comprises:

(A) a step of subjecting a substrate to at least either of (A-1) at least one treatment selected from the group consisting of an ultraviolet irradiation treatment, an oxygen plasma treatment, a nitrogen plasma treatment, a helium plasma treatment, an argon plasma treatment, a hydrogen plasma treatment and an ammonia plasma treatment, and (A-2) a treatment with at least one of alkoxysilane compound having a reactive group (hereinafter referred to as "reactive alkoxysilane") and a product of the hydrolysis and condensation thereof, and (B) a step of applying a composition for film formation which comprises an organic solvent and either or both of at least one compound selected from the group consisting of compounds represented by the following general formula (1) (hereinafter referred to as "compounds (1)"), compounds represented by the following general formula (2) (hereinafter referred to as "compounds (2)"), compounds represented by the following general formula (3) (hereinafter referred to as "compounds (3)"), and compounds represented by the following general formula (4) (hereinafter referred to as "compounds (4)") and a product obtained by hydrolyzing and condensing the at least one compound (hereinafter, this composition is referred to as "composition for film formation"), to the substrate and heating the resulting coating, $$HSi(OR^1)_3 \qquad (1)$$

wherein $R^1$ represents a monovalent organic group, $$R_a Si(OR^2)_{4-a} \qquad (2)$$

wherein R represents a fluorine atom or a monovalent organic group; $R^2$ represents a monovalent organic group; and a is an integer of 1 or 2, $$Si(OR^3)_4 \qquad (3)$$

wherein $R^3$ represents a monovalent organic group, $$R^4{}_b(R^5O)_{3-b}Si-(R^8)_d-Si(OR^6)_{3-c}R^7{}_c \qquad (4)$$

wherein $R^4$ to $R^7$ are the same or different and each represent a monovalent organic group; b and c are the same or different and each are an integer of 0 to 2; $R^8$ represents an oxygen atom, a phenylene group, or a group represented by —$(CH_2)_n$— (wherein n is an integer of 1 to 6); and d is 0 or 1.

The invention further provides an insulating film obtained by the method of film formation described above.

The invention still further provides a substrate for semiconductors using the insulating film.

DETAILED DESCRIPTION OF THE INVENTION

Step (A)

Examples of the substrate used in the invention include substrates which are for use in ordinary semiconductor formation and have a CVD film on the surface thereof. This CVD film is a deposited film which comprises silicon and at least one element selected from the group consisting of oxygen, carbon, nitrogen, and hydrogen. Examples of this deposited film include deposited films formed by the plasma polymerization of one or more of compounds such as tetramethoxysilane, tetraethoxysilane, methyltrimethoxysilane, methyltriethoxysilane, dimethyldimethoxysilane, dimethyldiethoxysilane, silane, tetramethylsilane, trimethylsilane, dimethylsilane, methylsilane, ethylsilane, phenylsilane, diphenylsilane, disilanomethane, bis(methylsilano)methane, 1,2-disilanoethane, 1,2-bis(methylsilano)ethane, 2,2-disilanopropane, 1,3,5-trisilano-2,4,6-trimethylene, 1,3-dimethyldisiloxane, 1,1,3,3-tetramethyldisiloxane, trimethylsiloxane, 1,3-bis(silanomethylene)disiloxane, bis(1-methyldisiloxanyl)methane, 2,2-bis(1-methyldisiloxanyl)propane, 2,4,6,8-tetramethylcyclotetrasiloxane, octamethylcyclotetrasiloxane, 2,4,6-trisilyltetrahydropyran, 2,5-disilyltetrahydrofuran, and derivatives of these in the presence of oxygen, carbon monoxide, carbon dioxide, nitrogen, argon, water, ozone, ammonia, $N_2O$, or the like.

In the method of film formation of the invention, the substrate having a CVD film is subjected to at least either of (A-1) at least one treatment selected from the group consisting of an ultraviolet irradiation treatment, an oxygen plasma treatment, a nitrogen plasma treatment, a helium plasma treatment, an argon plasma treatment, a hydrogen plasma treatment and an ammonia plasma treatment, and (A-2) a treatment with at least one of alkoxysilane compound having a reactive group and a product of the hydrolysis and condensation thereof, and a composition for film formation is applied thereto and cured.

(A-1)

The ultraviolet irradiation treatment preferably comprises irradiating the substrate with a light having a wavelength of 300 nm or shorter, preferably 200 nm or shorter. This irradiation is preferably conducted in an atmosphere of a gas containing oxygen. The irradiation intensity in this treatment is preferably from 1 to 100 mW/cm$^2$ and the ultraviolet irradiation time of the substrate is preferably from 0.5 to 100 seconds.

The oxygen plasma treatment, nitrogen plasma treatment, helium plasma treatment, argon plasma treatment, hydrogen plasma treatment or ammonia plasma treatment can be accomplished by treating the substrate with a plasma in the atmosphere of oxygen, nitrogen, helium, argon, hydrogen or ammonia. The pressure of this atmosphere is from 0.5 to 500 mTorr, and conditions for the plasma treatments generally include a temperature of from 50 to 150° C., an RF power of from 50 to 1,000 W, and a treatment time of from 0.1 to 5 minutes.

By subjecting the substrate having a CVD film to at least one treatment selected from the group consisting of an ultraviolet irradiation treatment, oxygen plasma treatment, nitrogen plasma treatment, helium plasma treatment, argon plasma treatment, hydrogen plasma treatment and ammonia plasma treatment, the substrate having a CVD film has hydrophilicity and therefore has improved adhesion to the insulating film to be formed thereon.

(A-2)

The reactive alkoxysilane which can be used in step (A-2) in the invention has a reactive group such as an epoxy, isocyanate, vinyl, hydroxyl, acetoxy, amino or mercapto group. A product of the hydrolysis and condensation of this compound can also be used.

Examples of the reactive alkoxysilane include 3-glycidoxypropyltrimethoxysilane, 3-glycidoxypropyltriethoxysilane, 3-glycidoxypropylmethyldimethoxysilane, 3-glycidoxypropylmethyltriethoxysilane, 2-(3,4-epoxycyclohexyl)ethyltrimethoxysilane, 2-(3,4-epoxycyclohexyl)ethyltriethoxysilane, 5,6-epoxyhexyltrimethoxysilane, 5,6-epoxyhexyltriethoxysilane, 3-isocyanotopropyltrimethoxysilane, 3-isocyanatopropyltriethoxysilane, vinyltrimethoxysilane, vinyltriethoxysilane, N-[2-(vinylbenzylamino)]-3-aminopropyltrimethoxysilane, N-[2-(vinylbenzylamino)]-3-aminopropyltriethoxysilane, N-(hydroxyethyl)-N-methylaminopropyltrimethoxysilane, N-(hydroxyethyl)-N-methylaminopropyltriethoxysilane, hydroxymethyltrimethoxysilane, hydroxymethyltriethoxysilane, acetoxymethyltrimethoxysilane, acetoxymethyltriethoxysilane, acetoxypropyltrimethoxysilane, acetoxypropyltriethoxysilane, N-(2-aminoethyl)-3-aminopropylmethyldimethoxysilane, N-(2-aminoethyl)-3-aminopropylmethyldiethoxysilane, N-(2-aminoethyl)-3-aminopropyltrimethoxysilane, N-(2-aminoethyl)-3-aminopropyltriethoxysilane, 3-aminopropyltrimethoxysilane, 3-aminopropyltriethoxysilane, N,N'-bis[3-(trimethoxysilyl)propyl]ethylenediamine, N,N'-bis[3-(triethoxysilyl)propyl]ethylenediamine, 3-mercaptopropyltrimethoxysilane, and 3-mercaptopropyltriethoxysilane.

Those alkoxysilane compounds having a reactive group can be used alone or in combination of two or more thereof.

Especially preferred alkoxysilane compounds having a reactive group are the alkoxysilane compounds having an amino group.

Method for applying at least either of the alkoxysilane compound having a reactive group and a product of the hydrolysis and condensation thereof to the substrate having a CVD film is a coating technique such as spin coating, dip coating, roll coating, spraying or scan coating. Of those coating techniques, spin coating is particularly preferable.

According to need, the alkoxysilane compound having a reactive group and/or the product of the hydrolysis and condensation thereof may be applied after having been diluted with an organic solvent.

The organic solvent that can be used is at least one member selected from the group consisting of alcohol solvents, ketone solvents, amide solvents, ester solvents and aprotic solvents.

An organic solvent is generally used for the reaction. The organic solvent that can be used is at least one member selected from the group consisting of alcohol solvents, ketone solvents, amide solvents, ester solvents, and aprotic solvents.

Examples of the alcohol solvents include monohydric alcohols such as methanol, ethanol, n-propanol, isopropanol, n-butanol, isobutanol, sec-butanol, t-butanol, n-pentanol, isopentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol and diacetone alcohol;

polyhydric alcohols such as ethylene glycol, 1,2-propylene glycol, 1,3-butylene glycol, pentanediol-2,4,2-methylpentanediol-2,4, hexanediol-2,5, heptanediol-2,4, 2-ethylhexanediol-1,3, diethylene glycol, dipropylene glycol, triethylene glycol and tripropylene glycol; and partial ethers of polyhydric alcohols, such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether and dipropylene glycol monopropyl ether.

Those alcohol solvents may be used alone or in combination of two or more thereof.

Examples of the ketone solvents include acetone, methyl ethyl ketone, methyl n-propyl ketone, methyl n-butyl ketone, diethyl ketone, methyl isobutyl ketone, methyl n-pentyl ketone, ethyl n-butyl ketone, methyl n-hexyl ketone, diisobutyl ketone, trimethylnonanone, cyclohexanone, 2-hexanone, methylcyclohexanone, 2,4-pentanedione, acetonylacetone, acetophenone and fenchone. Examples thereof further include β-diketones such as acetylacetone, 2,4-hexanedione, 2,4-heptanedione, 3,5-heptanedione, 2,4-octanedione, 3,5-octanedione, 2,4-nonanedione, 3,5-nonanedione, 5-methyl-2,4-hexanedione, 2,2,6,6-tetramethyl-3,5-heptanedione and 1,1,1,5,5,5-hexafluoro-2,4-heptanedione.

Those ketone solvents may be used alone or in combination of two or more thereof.

Examples of the amide solvents include formamide, N-methylformamide, N,N-dimethylformamide, N-ethylformamide, N,N-diethylformamide, acetamide, N-methylacetamide, N,N-dimethylacetamide, N-ethylacetamide, N,N-diethylacetamide, N-methylpropionamide, N-methylpyrrolidone, N-formylmorpholine, N-formylpiperidine, N-formylpyrrolidine, N-acetylmorpholine, N-acetylpiperidine, and N-acetylpyrrolidine.

Those amide solvents may be used alone or in combination of two or more thereof.

Examples of the ester solvents include diethyl carbonate, ethylene carbonate, propylene carbonate, methyl acetate, ethyl acetate, γ-butyrolactone, γ-valerolactone, n-propyl acetate, isopropyl acetate, n-butyl acetate, isobutyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxytriglycol acetate, ethyl propionate, n-butyl propionate, isoamyl propionate, diethyl oxalate, di-n-butyl oxalate, methyl lactate, ethyl lactate, n-butyl lactate, n-amyl lactate, diethyl malonate, dimethyl phthalate and diethyl phthalate.

Those ester solvents may be used alone or in combination of two or more thereof.

Examples of the aprotic solvents include acetonitrile, dimethyl sulfoxide, N,N,N',N'-tetraethylsulfamide, hexamethylphosphoric triamide, N-methylmorpholone, N-methylpyrrole, N-ethylpyrrole, N-methyl-Δ³-pyrroline, N-methylpiperidine, N-ethylpiperidine, N,N-dimethylpiperazine, N-methylimidazole, N-methyl-4-piperidone, N-methyl-2-piperidone, N-methyl-2-pyrrolidone, 1,3-dimethyl-2-imidazolidinone and 1,3-dimethyltetrahydro-2(1H)-pyrimidinone.

Of those organic solvents, organic solvents represented by the following general formula (5) are especially preferable:

$$R^{15}O(CHCH_3CH_2O)_gR^{16} \quad (5)$$

wherein $R^{15}$ and $R^{16}$ each independently represent a hydrogen atom or a monovalent organic group selected from alkyl groups having 1 to 4 carbon atoms and $CH_3CO$—; and g is an integer of 1 or 2.

Those organic solvents may be used alone or in combination of two or more thereof.

The alkoxysilane compound having a reactive group and/or product of the hydrolysis and condensation thereof, which have been applied to the substrate having a CVD film, is dried by heating. This drying can be conducted with a hot plate, oven, furnace or the like, for example, in the air, in a nitrogen or argon atmosphere, under vacuum, or in a reduced-pressure atmosphere having a controlled oxygen concentration. The drying is conducted at generally from 60 to 400° C., preferably from 60 to 200° C., for generally from 30 seconds to 2 hours, preferably from 30 seconds to 1 hour.

Through the treatment in step (A-2) described above, the alkoxysilane compound having a reactive group and/or the product of the hydrolysis and condensation thereof is deposited on the CVD film-bearing substrate in a thickness of generally 200 nm or smaller, preferably 100 nm or smaller, more preferably 50 nm or smaller.

Step (B)

The CVD film-bearing substrate thus treated is coated with a composition for film formation by a coating technique such as spin coating, dip coating, roll coating or spraying.

This coating operation can be conducted so as to form a coating film having a thickness on a dry basis of from about 0.02 to 2.5 μm in the case of single coating or from about 0.04 to 5.0 μm in the case of double coating. Thereafter, the wet coating film is dried at ordinary temperature or dried with heating at a temperature of about from 80 to 600° C. usually for about from 5 to 240 minutes. Thus, a vitreous or macromolecular insulating film can be formed.

In this operation, heating can be conducted with a hot plate, oven, furnace or the like, for example, in the air, in a nitrogen or argon atmosphere, under vacuum, or in a reduced-pressure atmosphere having a controlled oxygen concentration.

Irradiation with electron beams or ultraviolet rays can also be used for forming a coating film.

In order to control the curing rate of the coating film, stepwise heating or a suitably selected atmosphere, such as a nitrogen, air, oxygen or reduced-pressure atmosphere, can be used according to need.

The composition for film formation used in the invention contains either or both of at least one compound selected from the group consisting of the compounds (1) to (4) and a product obtained by hydrolyzing and condensing the above at least one compound.

In the invention, the term "hydrolyzate" means a hydrolyzate in which all the $R^1O$—, $R^2O$—, $R^3O$—, $R^5O$—, and $R^6O$— groups contained in the compounds (1) to (4) need not have been hydrolyzed. For example, the hydrolyzate may be one in which only one of those groups has been hydrolyzed or two or more thereof have been hydrolyzed or may be a mixture of those.

The term "product of hydrolysis and condensation" in the invention means a product formed from the hydrolyzate of at least one of the compounds (1) to (4) and condensing silanol groups of the hydrolyzate to form Si—O—Si bonds. In the invention, however, all the silanol groups need not have undergone condensation. Namely, that term means a concept which includes, for example, a condensate in which a slight proportion of the silanol groups have been condensed and a mixture of condensates which differ in the degree of condensation.

Compounds (1):

Examples of the monovalent organic group represented by $R^1$ in general formula (1) include alkyl, aryl, allyl and glycidyl groups.

The alkyl group preferably has 1 to 5 carbon atoms, and examples thereof include methyl, ethyl, propyl and butyl. These alkyl groups may be linear or branched, and may be ones in which one or more of the hydrogen atoms have been replaced with, for example, fluorine atoms.

In general formula (1), examples of the aryl group include phenyl, naphthyl, methylphenyl, ethylphenyl, chlorophenyl, bromophenyl and fluorophenyl.

Specific examples of the compounds represented by general formula (1) include trimethoxysilane, triethoxysilane, tri-n-propoxysilane, triisopropoxysilane, tri-n-butoxysilane, tri-sec-butoxysilane, tri-tert-butoxysilane and triphenoxysilane.

Preferred examples of the compounds (1) include trimethoxysilane, triethoxysilane, tri-n-propoxysilane and triisopropoxysilane.

Those compounds may be used alone or in combination of two or more thereof.

Compounds (2):

Examples of the monovalent organic groups represented by R and $R^2$ in general formula (2) include alkyl, aryl, allyl and glycidyl groups. In general formula (2), R is preferably a monovalent organic group, more preferably an alkyl or phenyl group.

The alkyl group preferably has 1 to 5 carbon atoms, and examples thereof include methyl, ethyl, propyl and butyl. These alkyl groups may be linear or branched, and may be ones in which one or more of the hydrogen atoms have been replaced with, for example, fluorine atoms.

In general formula (2), examples of the aryl group include phenyl, naphthyl, methylphenyl, ethylphenyl, chlorophenyl, bromophenyl and fluorophenyl.

Specific examples of the compounds represented by general formula (2) include fluorotrimethoxysilane, fluorotriethoxysilane, fluorotri-n-propoxysilane, fluorotriisopropoxysilane, fluorotri-n-butoxysilane, fluorotri-sec-butoxysilane, fluorotri-tert-butoxysilane and fluorotriphenoxysilane; methyltrimethoxysilane, methyltriethoxysilane, methyltri-n-propoxysilane, methyltriisopropoxysilane, methyltri-n-butoxysilane, methyltri-sec-butoxysilane, methyltri-tert-butoxysilane, methyltriphenoxysilane, ethyltrimethoxysilane, ethyltriethoxysilane, ethyltri-n-propoxysilane, ethyltriisopropoxysilane, ethyltri-n-butoxysilane, ethyltri-sec-butoxysilane, ethyltri-tert-butoxysilane, ethyltriphenoxysilane, vinyltrimethoxysilane, vinyltriethoxysilane, vinyltri-n-propoxysilane, vinyltriisopropoxysilane, vinyltri-n-butoxysilane, vinyltri-sec-butoxysilane, vinyltri-tert-butoxysilane, vinyltriphenoxysilane, n-propyltrimethoxysilane, n-propyltriethoxysilane, n-propyltri-n-propoxysilane, n-propyltriisopropoxysilane, n-propyltri-n-butoxysilane, n-propyltri-sec-butoxysilane, n-propyltri-tert-butoxysilane, n-propyltriphenoxysilane, isopropyltrimethoxysilane, isopropyltriethoxysilane, isopropyltri-n-propoxysilane, isopropyltriisopropoxysilane, isopropyltri-n-butoxysilane, isopropyltri-sec-butoxysilane, isopropyltri-tert-butoxysilane, isopropyltriphenoxysilane, n-butyltrimethoxysilane, n-butyltriethoxysilane, n-butyltri-n-propoxysilane, n-butyltriisopropoxysilane, n-butyltri-n-butoxysilane, n-butyltri-sec-butoxysilane, n-butyltri-tert-butoxysilane, n-butyltriphenoxysilane, sec-butyltrimethoxysilane, sec-butyltriethoxysilane, sec-butyltri-n-propoxysilane, sec-butyltriisopropoxysilane, sec-butyltri-n-butoxysilane, sec-butyltri-sec-butoxysilane, sec-butyltri-tert-butoxysilane, sec-butyltriphenoxysilane, tert-butyltrimethoxysilane, tert-butyltriethoxysilane, tert-butyltri-n-propoxysilane, tert-butyltriisopropoxysilane, tert-butyltri-n-butoxysilane, tert-butyltri-sec-butoxysilane, tert-butyltri-tert-butoxysilane, tert-butyltriphenoxysilane, phenyltrimethoxysilane, phenyltriethoxysilane, phenyltri-n-propoxysilane, phenyltriisopropoxysilane, phenyltri-n-butoxysilane, phenyltri-sec-butoxysilane, phenyltri-tert-butoxysilane, phenyltriphenoxysilane, vinyltrimethoxysilane, vinyltriethoxysilane, γ-aminopropyltrimethoxysilane, γ-aminopropyltriethoxysilane, γ-glycidoxypropyltrimethoxysilane, γ-glycidoxypropyltriethoxysilane, γ-trifluoropropyltrimethoxysilane and γ-trifluoropropyltriethoxysilane; and dimethyldimethoxysilane, dimethyldiethoxysilane, dimethyldi-n-propoxysilane, dimethyldiisopropoxysilane, dimethyldi-n-butoxysilane, dimethyldi-sec-butoxysilane, dimethyldi-tert-butoxysilane, dimethyldiphenoxysilane, diethyldimethoxysilane, diethyldiethoxysilane, diethyldi-n-propoxysilane, diethyldiisopropoxysilane, diethyldi-n-butoxysilane, diethyldi-sec-butoxysilane, diethyldi-tert-butoxysilane, diethyldiphenoxysilane, di-n-propyldimethoxysilane, di-n-propyldiethoxysilane, di-n-propyldi-n-propoxysilane, di-n-propyldiisopropoxysilane, di-n-propyldi-n-butoxysilane, di-n-propyldi-sec-butoxysilane, di-n-propyldi-tert-butoxysilane, di-n-propyldiphenoxysilane, diisopropyldimethoxysilane, diisopropyldiethoxysilane, diisopropyldi-n-propoxysilane, diisopropyldiisopropoxysilane, diisopropyldi-n-butoxysilane, diisopropyldi-sec-butoxysilane, diisopropyldi-tert-butoxysilane, diisopropyldiphenoxysilane, di-n-butyldimethoxysilane, di-n-butyldiethoxysilane, di-n-butyldi-n-propoxysilane, di-n-butyldiisopropoxysilane, di-n-butyldi-n-butoxysilane, di-n-butyldi-sec-butoxysilane, di-n-butyldi-tert-butoxysilane, di-n-butyldiphenoxysilane, di-sec-butyldimethoxysilane, di-sec-butyldiethoxysilane, di-sec-butyldi-n-propoxysilane, di-sec-butyldiisopropoxysilane, di-sec-butyldi-n-butoxysilane, di-sec-butyldi-sec-butoxysilane, di-sec-butyldi-tert-butoxysilane, di-sec-butyldiphenoxysilane, di-tert-butyldimethoxysilane, di-tert-butyldiethoxysilane, di-tert-butyldi-n-propoxysilane, di-tert-butyldiisopropoxysilane, di-tert-butyldi-n-butoxysilane, di-tert-butyldi-sec-butoxysilane, di-tert-butyldi-tert-butoxysilane, di-tert-butyldiphenoxysilane, diphenyldimethoxysilane, diphenyldiethoxysilane, diphenyldi-n-propoxysilane, diphenyldiisopropoxysilane, diphenyldi-n-butoxysilane, diphenyldi-sec-butoxysilane, diphenyldi-tert-butoxysilane, diphenyldiphenoxysilane and divinyltrimethoxysilane.

Preferred examples of the compounds (2) include methyltrimethoxysilane, methyltriethoxysilane, methyltri-n-propoxysilane, methyltriisopropoxysilane, ethyltrimethoxysilane, ethyltriethoxysilane, vinyltrimethoxysilane, vinyltriethoxysilane, phenyltrimethoxysilane, phenyltriethoxysilane, dimethyldimethoxysilane, dimethyldiethoxysilane, diethyldimethoxysilane, diethyldiethoxysilane, diphenyldimethoxysilane and diphenyldiethoxysilane.

Those compounds may be used alone or in combination of two or more thereof.

Compounds (3):

Examples of the monovalent organic group represented by $R^3$ in general formula (3) include the same monovalent organic groups as those enumerated above with regard to general formula (2).

Examples of the compounds represented by general formula (3) include tetramethoxysilane, tetraethoxysilane, tetra-n-propoxysilane, tetraisopropoxysilane, tetra-n-butoxysilane, tetra-sec-butoxysilane, tetra-tert-butoxysilane and tetraphenoxysilane.

Compounds (4):

Examples of the monovalent organic groups represented by $R^4$ to $R^7$ in general formula (4) include the same monovalent organic groups as those enumerated above with regard to general formula (2).

Examples of the compounds represented by general formula (4) wherein $R^8$ is an oxygen atom include hexamethoxydisiloxane, hexaethoxydisiloxane, hexaphenoxydisiloxane, 1,1,1,3,3-pentamethoxy-3-methyldisiloxane, 1,1,1,3,3-pentaethoxy-3-methyldisiloxane, 1,1,1,3,3-pentaphenoxy-3-methyldisiloxane, 1,1,1,3,3-pentamethoxy-3-ethyldisiloxane, 1,1,1,3,3-pentaethoxy-3-ethyldisiloxane, 1,1,1,3,3-pentaphenoxy-3-ethyldisiloxane, 1,1,1,3,3-pentamethoxy-3-phenyldisiloxane, 1,1,1,3,3-pentaethoxy-3-phenyldisiloxane, 1,1,1,3,3-pentaphenoxy-3-phenyldisiloxane, 1,1,3,3-tetramethoxy-1,3-dimethyldisiloxane, 1,1,3,3-tetraethoxy-1,3-dimethyldisiloxane, 1,1,3,3-tetraphenoxy-1,3-dimethyldisiloxane, 1,1,3,3-tetramethoxy-1,3-diethyldisiloxane, 1,1,3,3-tetraethoxy-1,3-diethyldisiloxane, 1,1,3,3-tetraphenoxy-1,3-diethyldisiloxane, 1,1,3,3-tetramethoxy-1,3-diphenyldisiloxane, 1,1,3,3-tetraethoxy-1,3-diphenyldisiloxane 1,1,3,3-tetraphenoxy-1,3-diphenyldisiloxane, 1,1,3-trimethoxy-1,3,3-trimethyidisiloxane, 1,1,3-triethoxy-1,3,3-trimethyldisiloxane, 1,1,3-triphenoxy-1,3,3-trimethyldisiloxane, 1,1,3-trimethoxy-1,3,3-triethyldisiloxane, 1,1,3-triethoxy-1,3,3-triethyldisiloxane, 1,1,3-triphenoxy-1,3,3-triethyldisiloxane, 1,1,3-trimethoxy-1,3,3-triphenyldisiloxane, 1,1,3-triethoxy-1,3,3-triphenyldisiloxane, 1,1,3-triphenoxy-1,3,3-triphenyldisiloxane, 1,3-dimethoxy-1,1,3,3-tetramethyldisiloxane, 1,3-diethoxy-1,1,3,3-tetramethyldisiloxane, 1,3-diphenoxy-1,1,3,3-tetramethyldisiloxane, 1,3-dimethoxy-1,1,3,3-tetraethyldisiloxane, 1,3-diethoxy-1,1,3,3-tetraethyldisiloxane, 1,3-diphenoxy-1,1,3,3-tetraethyldisiloxane, 1,3-dimethoxy-1,1,3,3-tetraphenyldisiloxane, 1,3-diethoxy-1,1,3,3-tetraphenyldisiloxane and 1,3-diphenoxy-1,1,3,3-tetraphenyldisiloxane.

Preferred of those compounds are hexamethoxydisiloxane, hexaethoxydisiloxane, 1,1,3,3-tetramethoxy-1,3-dimethyldisiloxane, 1,1,3,3-tetraethoxy-1,3-dimethyldisiloxane, 1,1,3,3-tetramethoxy-1,3-diphenyldisiloxane, 1,3-dimethoxy-1,1,3,3-tetramethyldisiloxane, 1,3-diethoxy-1,1,3,3-tetramethyldisiloxane, 1,3-dimethoxy-1,1,3,3-tetraphenyldisiloxane and 1,3-diethoxy-1,1,3,3-tetraphenyldisiloxane.

Examples of the compounds represented by general formula (4) wherein d is 0 include hexamethoxydisilane, hexaethoxydisilane, hexaphenoxydisilane, 1,1,1,2,2-pentamethoxy-2-methyldisilane, 1,1,1,2,2-pentaethoxy-2-methyldisilane, 1,1,1,2,2-pentaphenoxy-2-methyldisilane, 1,1,1,2,2-pentamethoxy-2-ethyldisilane, 1,1,1,2,2-pentaethoxy-2-ethyldisilane, 1,1,1,2,2-pentaphenoxy-2-ethyldisilane, 1,1,1,2,2-pentamethoxy-2-phenyldisilane, 1,1,1,2,2-pentaethoxy-2-phenyldisilane, 1,1,1,2,2-pentaphenoxy-2-phenyldisilane, 1,1,2,2-tetramethoxy-1,2-dimethyldisilane, 1,1,2,2-tetraethoxy-1,2-dimethyldisilane, 1,1,2,2-tetraphenoxy-1,2-dimethyldisilane, 1,1,2,2-tetramethoxy-1,2-diethyldisilane, 1,1,2,2-tetraethoxy-1,2-diethyldisilane, 1,1,2,2-tetraphenoxy-1,2-diethyldisilane, 1,1,2,2-tetramethoxy-1,2-diphenyldisilane, 1,1,2,2-tetraethoxy-1,2-diphenyldisilane, 1,1,2,2-tetraphenoxy-1,2-diphenyldisilane, 1,1,2-trimethoxy-1,2,2-trimethyldisilane, 1,1,2-triethoxy-1,2,2-trimethyldisilane, 1,1,2-triphenoxy-1,2,2-trimethyldisilane, 1,1,2-trimethoxy-1,2,2-triethyldisilane, 1,1,2-triethoxy-1,2,2-triethyldisilane, 1,1,2-triphenoxy-1,2,2-triethyldisilane, 1,1,2-trimethoxy-1,2,2-triphenyldisilane, 1,1,2-triethoxy-1,2,2-triphenyldisilane, 1,1,2-triphenoxy-1,2,2-triphenyldisilane, 1,2-dimethoxy-1,1,2,2-tetramethyldisilane, 1,2-diethoxy-1,1,2,2-tetramethyldisilane, 1,2-diphenoxy-1,1,2,2-tetramethyldisilane, 1,2-dimethoxy-1,1,2,2-tetraethyldisilane, 1,2-diethoxy-1,1,2,2-tetraethyldisilane, 1,2-diphenoxy-1,1,2,2-tetraethyldisilane, 1,2-dimethoxy-1,1,2,2-tetraphenyldisilane, 1,2-diethoxy-1,1,2,2-tetraphenyldisilane and 1,2-diphenoxy-1,1,2,2-tetraphenyldisilane.

Preferred of those compounds are hexamethoxydisilane, hexaethoxydisilane, 1,1,2,2-tetramethoxy-1,2-dimethyldisilane, 1,1,2,2-tetraethoxy-1,2-dimethyldisilane, 1,1,2,2-tetramethoxy-1,2-diphenyldisilane, 1,2-dimethoxy-1,1,2,2-tetramethyldisilane, 1,2-diethoxy-1,1,2,2-tetramethyldisilane, 1,2-dimethoxy-1,1,2,2-tetraphenyldisilane and 1,2-diethoxy-1,1,2,2-tetraphenyldisilane.

Examples of the compounds represented by general formula (4) wherein $R^8$ is a group represented by —$(CH_2)_n$— include bis(trimethoxysilyl)methane, bis(triethoxysilyl)methane, bis(tri-n-propoxysilyl)methane, bis(triisopropoxysilyl)methane, bis(tri-n-butoxysilyl)methane, bis(tri-sec-butoxysilyl)methane, bis(tri-t-butoxysilyl)methane, 1,2-bis(trimethoxysilyl)ethane, 1,2-bis(triethoxysilyl)ethane, 1,2-bis(tri-n-propoxysilyl)ethane, 1,2-bis(triisopropoxysilyl)ethane, 1,2-bis(tri-n-butoxysilyl)ethane, 1,2-bis(tri-sec-butoxysilyl)ethane, 1,2-bis(tri-t-butoxysilyl)ethane, 1-(dimethoxymethylsilyl)-1-(trimethoxysilyl)methane, 1-(diethoxymethylsilyl)-1-(triethoxysilyl)methane, 1-(di-n-propoxymethylsilyl)-1-(tri-n-propoxysilyl)methane, 1-(diisopropoxymethylsilyl)-1-(triisopropoxysilyl)methane, 1-(di-n-butoxymethylsilyl)-1-(tri-n-butoxysilyl)methane, 1-(di-sec-butoxymethylsilyl)-1-(tri-sec-butoxysilyl)methane, 1-(di-t-butoxymethylsilyl)-1-(tri-t-butoxysilyl)methane, 1-(dimethoxymethylsilyl)-2-(trimethoxysilyl)ethane, 1-(diethoxymethylsilyl)-2-(triethoxysilyl)ethane, 1-(di-n-propoxymethylsilyl)-2-(tri-n-propoxysilyl)ethane, 1-(diisopropoxymethylsilyl)-2-(triisopropoxysilyl)ethane, 1-(di-n-butoxymethylsilyl)-2-(tri-n-butoxysilyl)ethane, 1-(di-sec-butoxymethylsilyl)-2-(tri-sec-butoxysilyl)ethane, 1-(di-t-butoxymethylsilyl)-2-(tri-t-butoxysilyl)ethane, bis(dimethoxymethylsilyl)methane, bis(diethoxymethylsilyl)methane, bis(di-n-propoxymethylsilyl)methane, bis(diisopropoxymethylsilyl)methane, bis(di-n-butoxymethylsilyl)methane, bis(di-sec-butoxymethylsilyl)methane, bis(di-t-butoxymethylsilyl)methane, 1,2-bis(dimethoxymethylsilyl)ethane, 1,2-bis(diethoxymethylsilyl)ethane, 1,2-bis(di-n-propoxymethylsilyl)ethane, 1,2-bis(diisopropoxymethylsilyl)ethane, 1,2-bis(di-n-butoxymethylsilyl)ethane, 1,2-bis(di-sec-butoxymethylsilyl)ethane, 1,2-bis(di-t-butoxymethylsilyl)ethane, 1,2-bis(trimethoxysilyl)benzene, 1,2-bis(triethoxysilyl)benzene, 1,2-bis(tri-n-propoxysilyl)benzene, 1,2-bis(triisopropoxysilyl)benzene, 1,2-bis(tri-n-butoxysilyl)benzene, 1,2-bis(tri-sec-butoxysilyl)benzene, 1,2-bis(tri-t-butoxysilyl)benzene, 1,3-bis(trimethoxysilyl)benzene, 1,3-bis(triethoxysilyl)benzene, 1,3-bis(tri-n-propoxysilyl)benzene, 1,3-bis(triisopropoxysilyl)benzene, 1,3-bis(tri-n-butoxysilyl)benzene, 1,3-bis(tri-sec-butoxysilyl)benzene, 1,3-bis(tri-t-butoxysilyl)benzene, 1,4- bis(trimethoxysilyl)benzene, 1,4-bis(triethoxysilyl)benzene, 1,4-bis(tri-n-propoxysilyl)benzene, 1,4-bis(triisopropoxysilyl)benzene, 1,4-bis(tri-n-butoxysilyl)benzene, 1,4-bis(tri-sec-butoxysilyl)benzene and 1,4-bis(tri-t-butoxysilyl)benzene.

Of those, preferable compounds are bis(trimethoxysilyl)methane, bis(triethoxysilyl)methane, 1,2-bis(trimethoxysilyl)ethane, 1,2-bis(triethoxysilyl)ethane, 1-(dimethoxymethylsilyl)-1-(trimethoxysilyl)methane, 1-(diethoxymethylsilyl)-1-(triethoxysilyl)methane, 1-(dimethoxymethylsilyl)-2-(trimethoxysilyl)ethane, 1-(diethoxymethylsilyl)-2-(triethoxysilyl)ethane, bis(dimethoxymethylsilyl)methane, bis(diethoxymethylsilyl)methane, 1,2-bis(dimethoxymethylsilyl)ethane, 1,2-bis(diethoxymethylsilyl)ethane, 1,2-bis(trimethoxysilyl)benzene, 1,2-bis(triethoxysilyl)benzene, 1,3-bis(trimethoxysilyl)benzene, 1,3-bis(triethoxysilyl)benzene, 1,4-bis(trimethoxysilyl)benzene and 1,4-bis(triethoxysilyl)benzene.

When at least one silane compound selected from the group consisting of the compounds (1) to (4) is hydrolyzed and condensed, water is added preferably in an amount of from more than 0.5 mol to 150 mol, more preferably from more than 0.5 mol to 130 mol, per mol of the at least one silane compound selected from the compounds (1) to (4). In case where water is added in an amount of 0.5 mol or smaller, the resulting composition may give a coating film having poor cracking resistance. On the other hand, addition of water in an amount exceeding 150 mol may result in polymer precipitation or gelation during the hydrolysis and condensation reactions.

A catalyst is used in hydrolyzing and condensing at least one silane compound selected from the group consisting of the compounds (1) to (4).

Examples of catalysts usable in the hydrolysis and condensation include metal chelate compounds, acid catalysts and alkali catalysts.

Examples of the metal chelate compounds include titanium chelate compounds such as triethoxymono(acetylacetonato)titanium, tri-n-propoxymono(acetylacetonato)titanium, triisopropoxymono(acetylacetonato)titanium, tri-n-butoxymono(acetylacetonato)titanium, tri-sec-butoxymono(acetylacetonato)titanium, tri-t-butoxymono(acetylacetonato)titanium, diethoxybis(acetylacetonato)titanium, di-n-propoxybis(acetylacetonato)titanium, diisopropoxybis(acetylacetonato)titanium, di-n-butoxybis(acetylacetonato)titanium, di-sec-butoxybis(acetylacetonato)titanium, di-t-butoxybis(acetylacetonato)titanium, monoethoxytris(acetylacetonato)titanium, mono-n-propoxytris(acetylacetonato)titanium, monoisopropoxytris(acetylacetonato)titanium, mono-n-butoxytris(acetylacetonato)titanium, mono-sec-butoxytris(acetylacetonato)titanium, mono-t-butoxytris(acetylacetonato)titanium, tetrakis(acetylacetonato)titanium, triethoxymono(ethyl acetoacetate)titanium, tri-n-propoxymono(ethyl acetoacetate)titanium, triisopropoxymono(ethyl acetoacetate)titanium, tri-n-butoxymono(ethyl acetoacetate)titanium, tri-sec-butoxymono(ethyl acetoacetate)titanium, tri-t-butoxymono(ethyl acetoacetate)titanium, diethoxybis(ethyl acetoacetate)titanium, di-n-propoxybis(ethyl acetoacetate)titanium, diisopropoxybis(ethyl acetoacetate)titanium, di-n-butoxybis(ethyl acetoacetate)titanium, di-sec-butoxybis(ethyl acetoacetate)titanium, di-t-butoxybis(ethyl acetoacetate)titanium, monoethoxytris(ethyl acetoacetate)titanium, mono-n-propoxytris(ethyl acetoacetate)titanium, monoisopropoxytris(ethyl acetoacetate)titanium, mono-n-butoxytris(ethyl acetoacetate)titanium, mono-sec-butoxytris(ethyl acetoacetate)titanium, mono-t-butoxytris(ethyl acetoacetate)titanium, tetrakis(ethyl acetoacetate)titanium, mono(acetylacetonato)tris(ethyl acetoacetate)titanium, bis(acetylacetonato)bis(ethyl acetoacetate)titanium, and tris(acetylacetonato)mono(ethyl acetoacetate)titanium; zirconium chelate compounds such as triethoxymono(acetylacetonato)zirconium, tri-n-propoxymono(acetylacetonato)zirconium, triisopropoxymono(acetylacetonato)zirconium, tri-n-butoxymono(acetylacetonato)zirconium, tri-sec-butoxymono(acetylacetonato)zirconium, tri-t-butoxymono(acetylacetonato)zirconium, diethoxybis(acetylacetonato)zirconium, di-n-propoxybis(acetylacetonato)zirconium, diisopropoxybis(acetylacetonato)zirconium, di-n-butoxybis(acetylacetonato)zirconium, di-sec-butoxybis(acetylacetonato)zirconium, di-t-butoxybis(acetylacetonato)zirconium, monoethoxytris(acetylacetonato)zirconium, mono-n-propoxytris(acetylacetonato)zirconium, monoisopropoxytris(acetylacetonato)zirconium, mono-n-butoxytris(acetylacetonato)zirconium, mono-sec-butoxytris(acetylacetonato)zirconium, mono-t-butoxytris(acetylacetonato)zirconium, tetrakis(acetylacetonato)zirconium, triethoxymono(ethyl acetoacetate)zirconium, tri-n-propoxymono(ethyl acetoacetate)zirconium, triisopropoxymono(ethyl acetoacetate)zirconium, tri-n-butoxymono(ethyl acetoacetate)zirconium, tri-sec-butoxymono(ethyl acetoacetate)zirconium, tri-t-butoxymono(ethyl acetoacetate)zirconium, diethoxybis(ethyl acetoacetate)zirconium, di-n-propoxybis(ethyl acetoacetate)zirconium, diisopropoxybis(ethyl acetoacetate)zirconium, di-n-butoxybis(ethyl acetoacetate)zirconium, di-sec-butoxybis(ethyl acetoacetate)zirconium, di-t-butoxybis(ethyl acetoacetate)zirconium, monoethoxytris(ethyl acetoacetate)zirconium, mono-n-propoxytris(ethyl acetoacetate)zirconium, monoisopropoxytris(ethyl acetoacetate)zirconium, mono-n-butoxytris(ethyl acetoacetate)zirconium, mono-sec-butoxytris(ethyl acetoacetate)zirconium, mono-t-butoxytris(ethyl acetoacetate)zirconium, tetrakis(ethyl acetoacetate)zirconium, mono(acetylacetonato)tris(ethyl acetoacetate)zirconium, bis(acetylacetonato)bis(ethyl acetoacetate)zirconium and tris(acetylacetonato)mono(ethyl acetoacetate)zirconium; and aluminum chelate compounds such as tris(acetylacetonato)aluminum and tris(ethyl acetoacetate)aluminum. Preferred of these are the chelate compounds of titanium and/or aluminum. Especially preferred are the chelate compounds of titanium.

Those metal chelate compounds may be used alone or in combination of two or more thereof.

Examples of the acid catalysts include inorganic acids such as hydrochloric acid, nitric acid, sulfuric acid, hydrofluoric acid, phosphoric acid, boric acid and oxalic acid; and organic acids such as acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acids, phthalic acid, fumaric acid, citric acid, tartaric acid, succinic acid, itaconic acid, mesaconic acid, citraconic acid, malic acid, a glutaric acid hydrolyzate, a maleic anhydride hydrolyzate and a phthalic anhydride hydrolyzate. Of those, the organic acids are preferable.

Those acid catalysts may be used alone or in combination of two or more thereof.

Examples of the alkali catalysts include sodium hydroxide, potassium hydroxide, lithium hydroxide, pyridine, pyrrole, piperazine, pyrrolidine, piperidine, picoline, monoethanolamine, diethanolamine, dimethylmonoethanolamine, monomethyldiethanolamine, triethanolamine, diazabicyclooctane, diazabicyclononane, diazabicycloundecene, tetramethylammonium hydroxide, tetraethylammonium hydroxide, tetrapropylammonium hydroxide, tetrabutylammonium hydroxide, ammonia, methylamine, ethylamine, propylamine, butylamine, pentylamine, hexylamine, heptylamine, octylamine, nonylamine, decylamine, N,N-dimethylamine, N,N-diethylamine, N,N-dipropylamine, N,N-dibutylamine, trimethylamine, triethylamine, tripropylamine, tributylamine, cyclohexylamine, trimethylimidine, 1-amino-3-methylbutane and dimethylglycine. Of those, the organic amines are preferable. Especially preferred alkali catalysts from the standpoint of the adhesion of a silica film to substrates are ammonia, the alkylamines and tetramethylammonium hydroxide.

Those alkali catalysts may be used alone or in combination of two or more thereof.

The catalyst is used in an amount of generally from 0.00001 to 10 mol, preferably from 0.00005 to 5 mol, per mol of the sum of the $R^1O$—, $R^2O$—, $R^3O$—, $R^5O$— and $R^6O$— groups contained in the compounds (1) to (4). So long as the catalyst is used in an amount within that range, the possibility of polymer precipitation or gelation during the reaction is small.

From the standpoint of facilitating the formation of a coating film having a dielectric constant of 2.5 or lower, the catalyst used in the hydrolysis of at least one compound selected from the compounds (1) to (4), which is a reaction for obtaining a composition for film formation, is preferably an alkali catalyst.

The composition for film formation applied and heated in the invention is generally prepared by dissolving or dispersing the product of alkoxysilane hydrolysis and condensation in an organic solvent and optionally adding additives thereto.

This organic solvent may comprise at least one member selected from the group consisting of alcohol solvents, ketone solvents, amide solvents, ester solvents and aprotic solvents.

Of those, especially preferred organic solvents are ones represented by the following general formula (5):

$$R^{15}O(CHCH_3CH_2O)_gR^{16} \quad (5)$$

wherein $R^{15}$ and $R^{16}$ each independently represent a hydrogen atom or a monovalent organic group selected from alkyl groups having 1 to 4 carbon atoms and $CH_3CO$—; and g is an integer of 1 or 2.

Those organic solvents may be used alone or in combination of two or more thereof.

For preparing the composition for film formation used in the invention, the same solvent as that used for hydrolyzing and/or condensing at least one of the compounds (1) to (4) in producing the product of alkoxysilane hydrolysis and condensation can be used.

For example, the composition is obtained in the following manner. Water or solvent-diluted water is added intermittently or continuously to a solvent containing at least one of the compounds (1) to (4) dissolved therein. In this operation, a catalyst may be added beforehand to the solvent or may be dissolved or dispersed in the water prior to the addition of water. The reaction temperature in this case is generally from 0 to 100° C., preferably from 15 to 90° C.

Other Additives:

Ingredients such as colloidal silica, organic polymers, surfactants, silane coupling agents and radical generators may be added to the composition for film formation used in the invention.

Examples of the organic polymers include compounds having a sugar chain structure, vinyl amide polymers, (meth) acrylic polymers, aromatic vinyl compounds, dendrimers, polyimides, poly(amic acid)s, polyarylenes, polyamides, polyquinoxaline, polyoxadiazole, fluoropolymers and compounds having a poly(alkylene oxide) structure.

Examples of the surfactants include nonionic surfactants, anionic surfactants, cationic surfactants and amphoteric surfactants, and further include fluorochemical surfactants, silicone surfactants, poly(alkylene oxide) surfactants and poly(meth)acrylate surfactants. Of those, fluorochemical surfactants and silicone surfactants are preferable.

The thus-obtained composition for film formation used in the invention has a total solid concentration of preferably from 1 to 30% by weight. The solid concentration thereof is suitably regulated according to the intended use thereof. When the composition has a total solid concentration of from 1 to 30% by weight, the composition not only gives a coating film having an appropriate thickness but has better storage stability.

The total solid concentration of the composition is regulated, according to need, by means of concentration or dilution with any of the organic solvents enumerated above.

The dielectric film according to the invention has excellent adhesion to CVD films. Consequently, the dielectric film of the invention is useful in applications such as dielectric films or etching stopper films for semiconductor devices such as LSIs, system LSIs, DRAMs, SDRAMs, RDRAMs and D-RDRAMs, protective films such as surface coat films for semiconductor devices, interlayers for use in semiconductor production processes using a multilaminated resist, dielectric films for multilaminated printed wiring boards, protective or insulating films for liquid crystal display elements, and protective or insulating films for electroluminescent display elements.

The invention will be explained below in more detail by reference to the following Examples. However, the following description merely shows general embodiment examples of the invention, and it should be understood that the invention is not construed as being limited by the description without particular reasons.

In the following Examples and Comparative Examples, all "parts" and "percents" are by weight unless otherwise indicated.

Various properties were evaluated by the following methods.

Radius of Gyration

Measured by gel permeation chromatography (GPC) (refractive index, viscosity, or light scattering measurement) under the following conditions.

Sample solution: A product of the hydrolysis and condensation of alkoxysilanes was diluted with methanol containing 10 mM LiBr to a solid concentration of 0.25% to prepare a sample solution for GPC (refractive index, viscosity, or light scattering measurement).

Apparatus:

GPC system: Model GPC-8020, manufactured by Tosoh Corp.

Column: Alpha 5000/3000, manufactured by Tosoh Corp.

Viscosity detector and light scattering detector: Model T-60 Dual Meter, manufactured by Viscotek Corp.

Carrier solution: methanol containing 10 mM LiBr

Carrier feed rate: 1 ml/min

Column temperature: 40° C.

Dielectric Constant of Coating Film

A composition sample was applied to an 8-inch silicon wafer by spin coating. The coated substrate was dried on a hot plate first at 80° C. for 1 minute and subsequently in a nitrogen atmosphere at 200° C. for 1 minute, and was then cured in a 430° C. nitrogen atmosphere in a furnace for 18 minutes. An aluminum electrode pattern was formed on the film obtained, by vapor deposition. Thus, a sample for dielectric constant measurement was produced. This sample was examined at a frequency of 100 kHz with electrodes HP16451B and precision LCR meter HP4284A, both manufactured by Yokogawa-Hewlett-Packard, Ltd., by the CV method to determine the dielectric constant of the coating film.

Adhesion of Laminated Film

A substrate having a laminated film was immersed in 60° C. hot water for 50 hours and then dried on a 100° C. hot plate for 10 minutes. Ten stud pins were fixed to the uppermost layer of the thus-treated substrate with an epoxy resin. After the epoxy resin applied was cured at 150° C. for 1 hour, the stud pins were pulled out by the Sebastian method to evaluate adhesion based on the following criteria.

o: No peeling occurred at the interface between the CVD film and the coating film with respect to each of the ten stud pins.

X: Peeling occurred at the interface between the CVD film and the coating film.

SYNTHESIS EXAMPLE 1

570 g of distilled ethanol, 160 g of ion-exchanged water and 30 g of 10% aqueous tetramethylammonium hydroxide solution were introduced into a separable flask made of quartz. The contents were uniformly stirred. A mixture of 136 g of methyltrimethoxysilane and 209 g of tetraethoxysilane was added to this solution. Reaction was conducted for 5 hours while maintaining the resulting solution at 60° C. 300 g of propylene glycol monopropyl ether was added to this solution. The resulting solution was concentrated with a 50° C. evaporator until the concentration reached 10% (in terms of the content of the product of complete hydrolysis and condensation). 10 g of a 10% acetic acid solution in propylene glycol monopropyl ether was added to the concentrate. Thus, a reaction mixture (1) was obtained.

The product of condensation and other reactions thus obtained had a radius of gyration of 17.8 nm and a dielectric constant of 2.21.

SYNTHESIS EXAMPLE 2

470.9 g of distilled ethanol, 226.5 g of ion-exchanged water and 10.2 g of 10% aqueous potassium hydroxide solution were introduced into a separable flask made of quartz. The contents were uniformly stirred. A mixture of 44.9 g of methyltrimethoxysilane and 68.6 g of tetraethoxysilane was added to this solution over 30 minutes. Reaction was conducted for 2 hours while maintaining the resulting solution at 55° C. 80 g of 20% aqueous maleic acid solution was added to this solution. This mixture was sufficiently stirred and then cooled to room temperature. 400 g of propylene glycol monopropyl ether was added to this solution. The resulting solution was concentrated with a 50° C. evaporator until the concentration reached 10% (in terms of the content of the product of complete hydrolysis and condensation). 10 g of a 10% maleic acid solution in propylene glycol monopropyl ether was added to the concentrate. Thus, a reaction mixture (2) was obtained.

The product of condensation and other reactions thus obtained had a radius of gyration of 23.4 nm and a dielectric constant of 2.11.

SYNTHESIS EXAMPLE 3

In a separable flask made of quartz, 324.40 g of methyltrimethoxysilane and 123.64 g of triethoxysilane were dissolved in 298 g of propylene glycol monoethyl ether. This mixture was stirred with a Three-One Motor to maintain the solution temperature at 50° C. 254 g of ion-exchanged water containing 0.20 g of phthalic acid dissolved therein was added to the solution over 1 hour. Reaction was conducted at 50° C. for 3 hours, and 502 g of propylene glycol monoethyl ether was added thereto. This reaction mixture was cooled to room temperature. A solution containing methanol and ethanol was removed in an amount of 502 g from the reaction mixture by evaporation at 50° C. Thus, a reaction mixture (3) was obtained.

The product of condensation and other reactions thus obtained had a radius of gyration of 0.2 nm and a dielectric constant of 2.72.

SYNTHESIS EXAMPLE 4

In a separable flask made of quartz, 77.04 g of distilled trimethoxysilane and 0.48 g of distilled tetrakis (acetylacetonato)titanium were dissolved in 290 g of distilled propylene glycol monopropyl ether. This mixture was stirred with a Three-One Motor to maintain the solution temperature at 60° C. 84 g of ion-exchanged water was added to this solution over 1 hour. Reaction was conducted at 60° C. for 2 hours. 25 g of distilled acetylacetone was added, and this reaction mixture was reacted for 30 minutes and then cooled to room temperature. A solution containing methanol and water was removed in an amount of 149 g from the reaction mixture by evaporation at 50° C. Thus, a reaction mixture (4) was obtained.

The product of condensation and other reactions thus obtained had a radius of gyration of 0.3 nm and a dielectric constant of 2.96.

EXAMPLE 1

Using Producer S, manufactured by Applied Material, a CVD film having a thickness of 1,000 Å was formed from tetramethylsilane on an 8-inch silicon wafer. This deposited film had the following elemental composition: Si, 26 atomic %; O, 3 atomic %; C, 26 atomic %; H, 45 atomic %.

This substrate was irradiated for 10 seconds with a light having a wavelength of 172 nm using UVS-4200, manufactured by Ushio Inc. The substrate thus treated was coated with the reaction mixture (1) in a thickness of 5,000 Å and then dried at 80° C. for 1 minute and then at 200° C. for 1 minute. This substrate was cured for. 18 minutes in a 430° C. nitrogen atmosphere in a furnace.

The laminated film thus formed was evaluated for adhesion. As a result, no peeling was observed at the interface between the CVD film and the coating film.

EXAMPLE 2

Using Producer S, manufactured by Applied Material, a CVD film having a thickness of 1,000 Å was formed from tetramethylsilane on an 8-inch silicon wafer. This deposited film had the following elemental composition: Si, 26 atomic %; O, 3 atomic %; C, 26 atomic %; H, 45 atomic %.

This substrate was placed in RE-654X-II, manufactured by Hitachi, Ltd. Oxygen was introduced into the chamber and the pressure was regulated to 2 mTorr. In this chamber, a 400 W plasma treatment was conducted for 60 seconds. The substrate thus treated was coated with the reaction mixture (2) in a thickness of 4,000 Å and then dried at 80° C. for 1 minute and then at 200° C. for 1 minute. This substrate was cured in a 430° C. nitrogen atmosphere in a furnace for 18 minutes.

The laminated film thus formed was evaluated for adhesion. As a result, no peeling was observed at the interface between the CVD film and the coating film.

EXAMPLE 3

Using Sequel Express, manufactured by Nevellus, a CVD film having a thickness of 1,000 Å was formed from trimethylsilane on an 8-inch silicon wafer. This deposited film had the following elemental composition: Si, 25 atomic %; O, 4 atomic %; C, 21 atomic %; N, 14 atomic %; H, 36 atomic %.

This substrate was placed in RE-654X-II, manufactured by Hitachi, Ltd. Nitrogen was introduced into the chamber and the pressure was regulated to 2 mTorr. In this chamber, a 400 W plasma treatment was conducted for 60 seconds. The substrate thus treated was coated with the reaction mixture (1) in a thickness of 4,000 Å and then dried at 80° C. for 1 minute and then at 200° C. for 1 minute. This substrate was cured in a 430° C. nitrogen atmosphere in a furnace for 18 minutes.

The laminated film thus formed was evaluated for adhesion. As a result, no peeling was observed at the interface between the CVD film and the coating film.

EXAMPLE 4

Using Sequel Express, manufactured by Nevellus, a CVD film having a thickness of 1,000 Å was formed from silane and ammonia on an 8-inch silicon wafer. This deposited film had the following elemental composition: Si, 50 atomic %; O, 4 atomic %; C, 3 atomic %; N, 40 atomic %; H, 4 atomic %.

This substrate was placed in RE-654X-II, manufactured by Hitachi, Ltd. Argon was introduced into the chamber and the pressure was regulated to 2 mTorr. In this chamber, a 400 W plasma treatment was conducted for 60 seconds. The substrate thus treated was coated with a mixture of 50 g of the reaction mixture (2) and 5 g of the reaction mixture (3) in a thickness of 4,000 Å and then dried at 80° C. for 1 minute and further at 200° C. for 1 minute. This substrate was cured in a 430° C. nitrogen atmosphere in a furnace for 18 minutes.

The laminated film thus formed was evaluated for adhesion. As a result, no peeling was observed at the interface between the CVD film and the coating film.

EXAMPLE 5

Using Producer S, manufactured by Applied Material, a CVD film having a thickness of 1,000 Å was formed from tetramethylsilane on an 8-inch silicon wafer. This deposited film had the following elemental composition: Si, 26 atomic %; O, 3 atomic %; C, 26 atomic %; H, 45 atomic %.

This substrate was placed in RE-654X-II, manufactured by Hitachi, Ltd. Helium was introduced into the chamber and the pressure was regulated to 2 mTorr. In this chamber, a 400 W plasma treatment was conducted for 60 seconds. The substrate thus treated was coated with a mixture of 30 g of the reaction mixture (1) and 5 g of the reaction mixture (4) in a thickness of 5,000 Å and then dried at 80° C. for 1 minute and further at 200° C. for 1 minute. This substrate was cured in a 430° C. nitrogen atmosphere in a furnace for 18 minutes.

The laminated film thus formed was evaluated for adhesion. As a result, no peeling was observed at the interface between the CVD film and the coating film.

EXAMPLE 6

Using Sequel Express, manufactured by Nevellus, a CVD film having a thickness of 1,000 Å was formed from trimethylsilane on an 8-inch silicon wafer. This deposited film had the following elemental composition: Si, 25 atomic %; O, 4 atomic %; C, 21 atomic %; N, 14 atomic %; H, 36 atomic %.

This substrate was placed in RE-654X-II, manufactured by Hitachi, Ltd. Hydrogen was introduced into the chamber and the pressure was regulated to 2 mTorr. In this chamber, a 400 W plasma treatment was conducted for 60 seconds. The substrate thus treated was coated with the reaction mixture (1) in a thickness of 5,000 Å and then dried at 80° C. for 1 minute and further at 200° C. for 1 minute. This substrate was cured in a 430° C. nitrogen atmosphere in a furnace for 18 minutes.

The laminated film thus formed was evaluated for adhesion. As a result, no peeling was observed at the interface between the CVD film and the coating film.

EXAMPLE 7

Using Sequel Express, manufactured by Nevellus, a CVD film having a thickness of 1,000 Å was formed from trimethylsilane on an 8-inch silicon wafer. This deposited film had the following elemental composition: Si, 25 atomic %; O, 4 atomic %; C, 21 atomic %; N, 14 atomic %; H, 36 atomic %.

This substrate was placed in RE-654X-II, manufactured by Hitachi, Ltd. Ammonia was introduced into the chamber and the pressure was regulated to 2 mTorr. In this chamber, a 400 W plasma treatment was conducted for 60 seconds. The substrate thus treated was coated with the reaction mixture (1) in a thickness of 5,000 Å and then dried at 80° C. for 1 minute and further at 200° C. for 1 minute. This substrate was cured in a 430° C. nitrogen atmosphere in a furnace for 18 minutes.

The laminated film thus formed was evaluated for adhesion. As a result, no peeling was observed at the interface between the CVD film and the coating film.

EXAMPLE 8

Using Producer S, manufactured by Applied Material, a CVD film having a thickness of 1,000 Å was formed from tetraethoxysilane on an 8-inch silicon wafer. This film had the following elemental composition: Si, 32 atomic %; O, 64 atomic %; H, 4 atomic %.

Propylene glycol monopropyl ether containing 3-glycidoxypropyltriethoxysilane dissolved therein in a concentration of 2% was applied to the deposited film at a rotational speed of 1,500 rpm for 20 seconds. This substrate was dried at 80° C. for 1 minute and furtehr at 200° C. for 1 minute. The substrate was further coated with the reaction mixture (1) in a thickness of 5,000 Å and then dried at 80°

C. for 1 minute and further at 200° C. for 1 minute. This substrate was cured on a 405° C. hot plate in a nitrogen atmosphere for 30 minutes.

The laminated film thus formed was evaluated for adhesion. As a result, no peeling was observed at the interface between the CVD film and the overlying film.

EXAMPLE 9

Using Producer S, manufactured by Applied Material, a CVD film having a thickness of 1,000 Å was formed from tetramethylsilane on an 8-inch silicon wafer. This film had the following elemental composition: Si, 26 atomic %; O, 3 atomic %; C, 26 atomic %; H, 45 atomic %.

Propylene glycol monopropyl ether containing N-[2-(vinylbenzylamino)]-3-aminopropyltrimethoxysilane dissolved therein in a concentration of 2% was applied to the deposited film at a rotational speed of 1,500 rpm for 20 seconds. This substrate was dried at 80° C. for 1 minute and further at 200° C. for 1 minute. The substrate was further coated with the reaction mixture (2) in a thickness of 4,000 Å and then dried at 80° C. for 1 minute and further at 200° C. for 1 minute. This substrate was cured on a 405° C. hot plate in a nitrogen atmosphere for 30 minutes.

The laminated film thus formed was evaluated for adhesion. As a result, no peeling was observed at the interface between the CVD film and the overlying film.

EXAMPLE 10

Using Sequel Express, manufactured by Nevellus, a CVD film having a thickness of 1,000 Å was formed from trimethylsilane on an 8-inch silicon wafer. This film had the following elemental composition: Si, 25 atomic %; O, 4 atomic %; C, 21 atomic %; N, 14 atomic %; H, 36 atomic %.

Propylene glycol monopropyl ether containing 3-isocyanatopropyltriethoxysilane dissolved therein in a concentration of 2% was applied to the deposited film at a rotational speed of 1,500 rpm for 20 seconds. This substrate was dried at 80° C. for 1 minute and further at 200° C. for 1 minute. The substrate was further coated with the reaction mixture (1) in a thickness of 4,000 Å and then dried at 80° C. for 1 minute and further at 200° C. for 1 minute. This substrate was cured on a 405° C. hot plate in a nitrogen atmosphere for 30 minutes.

The laminated film thus formed was evaluated for adhesion. As a result, no peeling was observed at the interface between the CVD film and the overlying film.

EXAMPLE 11

Using Sequel Express, manufactured by Nevellus, a CVD film having a thickness of 1,000 Å was formed from silane and ammonia on an 8-inch silicon wafer. This film had the following elemental composition: Si, 50 atomic %; O, 4 atomic %; C, 3 atomic %; N, 40 atomic %; H, 4 atomic %.

Propylene glycol monopropyl ether containing N-hydroxyethyl-N-methylaminopropyltrimethoxysilane dissolved therein in a concentration of 2% was applied to the deposited film at a rotational speed of 1,500 rpm for 20 seconds. This substrate was dried at 80° C. for 1 minute and further at 200° C. for 1 minute. The substrate was further coated with the reaction mixture (2) in a thickness of 4,000 Å and then dried at 80° C. for 1 minute and further at 200° C. for 1 minute. This substrate was cured on a 405° C. hot plate in a nitrogen atmosphere for 30 minutes.

The laminated film thus formed was evaluated for adhesion. As a result, no peeling was observed at the interface between the CVD film and the overlying film.

EXAMPLE 12

Using Sequel Express, manufactured by Nevellus, a CVD film having a thickness of 1,000 Å was formed from trimethylsilane on an 8-inch silicon wafer. This film had the following elemental composition: Si, 25 atomic %; O, 4 atomic %; C, 21 atomic %; N, 14 atomic %; H, 36 atomic %.

Propylene glycol monopropyl ether containing acetoxymethyltriethoxysilane dissolved therein in a concentration of 2% was applied to the deposited film at a rotational speed of 1,500 rpm for 20 seconds. This substrate was dried at 80° C. for 1 minute and further at 200° C. for 1 minute. The substrate was further coated with a mixture of 20 g of the reaction mixture (1) and 20 g of the reaction mixture (3) in a thickness of 4,000 Å and then dried at 80° C. for 1 minute and further at 200° C. for 1 minute. This substrate was cured on a 405° C. hot plate in a nitrogen atmosphere for 30 minutes.

The laminated film thus formed was evaluated for adhesion. As a result, no peeling was observed at the interface between the CVD film and the overlying film.

EXAMPLE 13

Using Producer S, manufactured by Applied Material, a CVD film having a thickness of 1,000 Å was formed from tetramethylsilane on an 8-inch silicon wafer. This film had the following elemental composition: Si, 26 atomic %; O, 3 atomic %; C, 26 atomic %; H, 45 atomic %.

Propylene glycol monopropyl ether containing N-(2-aminoethyl)-3aminopropyltrimethoxysilane dissolved therein in a concentration of 2% was applied to the deposited film at a rotational speed of 1,500 rpm for 20 seconds. This substrate was dried at 80° C. for 1 minute and further at 200° C. for 1 minute. The substrate was further coated with a mixture of 20 g of the reaction mixture (2) and 20 g of the reaction mixture (4) in a thickness of 4,000 Å and then dried at 80° C. for 1 minute and further at 200° C. for 1 minute. This substrate was cured on a 405° C. hot plate in a nitrogen atmosphere for 30 minutes.

The laminated film thus formed was evaluated for adhesion. As a result, no peeling was observed at the interface between the CVD film and the overlying film.

EXAMPLE 14

Using Sequel Express, manufactured by Nevellus, a CVD film having a thickness of 1,000 Å was formed from trimethylsilane on an 8-inch silicon wafer. This film had the following elemental composition: Si, 25 atomic %; O, 4 atomic %; C, 21 atomic %; N, 14 atomic %; H, 36 atomic %.

Propylene glycol monopropyl ether containing 3-mercaptopropyltriethoxysilane dissolved therein in a concentration of 2% was applied to the deposited film at a rotational speed of 1,500 rpm for 20 seconds. This substrate was dried at 80° C. for 1 minute and further at 200° C. for 1 minute. The substrate was further coated with the reaction mixture (1) in a thickness of 4,000 Å and then dried at 80° C. for 1 minute and further at 200° C. for 1 minute. This substrate was cured on a 405° C. hot plate in a nitrogen atmosphere for 30 minutes.

The laminated film thus formed was evaluated for adhesion. As a result, no peeling was observed at the interface between the CVD film and the overlying film.

COMPARATIVE EXAMPLE 1

Using Producer S, manufactured by Applied Material, a CVD film having a thickness of 1,000 Å was formed from tetraethoxysilane on an 8-inch silicon wafer. This film had the following elemental composition: Si, 32 atomic %; O, 64 atomic %; H, 4 atomic %.

The reaction mixture (1) was applied to the deposited film in a thickness of 5,000 Å, and the substrate was then dried at 80° C. for 1 minute and further at 200° C. for 1 minute. This substrate was cured in a 430° C. nitrogen atmosphere in a furnace for 18 minutes.

The laminated film thus formed was evaluated for adhesion. As a result, peeling was observed at the interface between the CVD film and the coating film with respect to eight of the stud pins.

COMPARATIVE EXAMPLE 2

Using Producer S, manufactured by Applied Material, a CVD film having a thickness of 1,000 Å was formed from tetraethoxysilane on an 8-inch silicon wafer. This film had the following elemental composition: Si, 32 atomic %; O, 64 atomic %; H, 4 atomic %.

The reaction mixture (2) was applied to the deposited film in a thickness of 5,000 Å, and the substrate was then dried at 80° C. for 1 minute and further at 200° C. for 1 minute. This substrate was cured in a 430° C. nitrogen atmosphere in a furnace for 18 minutes.

The laminated film thus formed was evaluated for adhesion. As a result, peeling was observed at the interface between the CVD film and the coating film with respect to eight of the stud pins.

According to the meted of film formation of the invention, a coating layer of a product of alkoxysilane hydrolysis and condensation is formed on a substrate after a step in which the substrate is subjected to at least either of (A-1) at least one treatment selected from the group consisting of an ultraviolet irradiation treatment, oxygen plasma treatment, nitrogen plasma treatment, helium plasma treatment, argon plasma treatment, hydrogen plasma treatment and ammonia plasma treatment, and (A-2) a treatment with either or both of at least one alkoxysilane compound having a reactive group and a product of the hydrolysis and condensation thereof. Due to this constitution, a dielectric film (substrate for semiconductors) having excellent adhesion to the CVD film can be provided.

What is claimed is:

1. A method of forming a film on a substrate to form film coated substrate, which comprises:
   (A) a step of subjecting a semiconductor substrate to at least one treatment (A-1) selected from the group consisting of an ultraviolet irradiation treatment, an oxygen plasma treatment, a nitrogen plasma treatment, a helium plasma treatment, an argon plasma treatment, a hydrogen plasma treatment and an ammonia plasma treatment; and
   (B) a step of applying a composition for film formation to the treated semiconductor substrate which comprises an organic solvent and either or both of at least one compound selected from the group consisting of compounds represented by the following formulae (1) to (4), and a product obtained by hydrolyzing and condensing the at least one compound, to the substrate and heating the resulting coating, $$HSi(OR^1)_3 \tag{1}$$

wherein $R^1$ represents a monovalent organic group,

wherein R represents a fluorine atom or a monovalent organic group; $R^2$ represents a monovalent organic group; and a is an integer of 1 or 2, $$Si(OR^3)_4 \tag{3}$$

wherein $R^3$ represents a monovalent organic group,

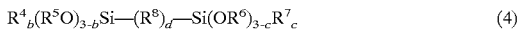

wherein $R^4$ to $R^7$ are the same or different and each represents a monovalent organic group; b and c are the same or different and each is an integer of 0 to 2; $R^8$ represents an oxygen atom, a phenylene group, or a group represented by $-(CH_2)_n-$ (wherein n is an integer of 1 to 6); and d is 0 or 1.

2. The method of film formation as claimed in claim 1, wherein the hydrolysis and condensation of the silane compound of step (B) is conducted in the presence of an alkali catalyst.

3. The method as claimed in claim 1, wherein the R and $R^1$ to $R^7$ groups of the silane compounds of formulas (1) to (4) are selected from the group consisting of alkyl, aryl, allyl and glycidyl.

4. The method as claimed in claim 1, wherein the $R^8$ bridging group of the silane compound of formula (4) has the formula $-(CH_2)_n-$, wherein n=1 to 6.

5. The method as claimed in claim 1, wherein the at least one silane compound of formula (1) to (4) is hydrolyzed and condensed in the presence of water in an amount of 0.5 mol to 150 mol per one mol of the at least one silane compound.

6. The method as claimed in claim 5, wherein the at least one silane compound of formula (1) to (4) is hydrolyzed and condensed in the presence of water in an amount of 0.5 mol to 130 mol per one mol of the at least one silane compound.

7. The method as claimed in claim 1, wherein the substrate is a silicon wafer.

8. A method of forming a film on a substrate, which comprises:
   (A') a step of forming a film comprising silicon and at least one element selected from the group consisting of oxygen, carbon, nitrogen and hydrogen on a substrate by chemical vapor deposition;
   (A) a step of subjecting a substrate to at least either of at least one treatment (A-1) selected from the group consisting of an ultraviolet irradiation treatment, an oxygen plasma treatment, a nitrogen plasma treatment, a helium plasma treatment, an argon plasma treatment, a hydrogen plasma treatment and an ammonia plasma treatment, or a treatment (A-2) with at least one of alkoxysilane compound having a reactive group and a product of the hydrolysis and condensation thereof; and
   (B) a step of applying a composition for film formation which comprises an organic solvent and either or both of at least one compound selected from the group consisting of compounds represented by the following general formulae (1) to (4), and a product obtained by hydrolyzing and condensing the at least one compound, to the substrate and heating the resulting coating, $$HSi(OR^1)_3 \tag{1}$$

wherein $R^1$ represents a monovalent organic group,

wherein R represents a fluorine atom or a monovalent organic group; $R^2$ represents a monovalent organic group; and a is an integer of 1 or 2, $$Si(OR^3)_4 \qquad (3)$$

wherein $R^3$ represents a monovalent organic group, $$R^4{}_b(R^5O)_{3-b}Si-(R^8)_d-Si(OR^6)_{3-c}R^7{}_c \qquad (4)$$

wherein $R^4$ to $R^7$ are the same or different and each represents a monovalent organic group; b and c are the same or different and each is an integer of 0 to 2; $R^8$ represents an oxygen atom, a phenylene group, or a group represented by $-(CH_2)_n-$, wherein n is an integer of 1 to 6; and d is 0 or 1.

9. The method of film formation as claimed in claim 8, wherein the reactive group of the alkoxysilane compound used in step (A-2) is at least one member selected from the group consisting of epoxy, isocyanate, vinyl, hydroxyl, acetoxy, amino and mercapto groups.

10. The method of film formation as claimed in claim 8, wherein the hydrolysis and condensation of the silane compound of step (B) is conducted in the presence of an alkali catalyst.

11. The method as claimed in claim 8, wherein the R and $R^1$ to $R^7$ groups of the silane compounds of formulas (1) to (4) are selected from the group consisting of alkyl, aryl, allyl and glycidyl.

12. The method as claimed in claim 8, wherein the $R^8$ bridging group of the silane compound of formula (4) has the formula $-(CH_2)_n-$, wherein n=1 to 6.

13. The method as claimed in claim 8, wherein the at least one silane compound of formula (1) to (4) is hydrolyzed and condensed in the presence of water in an amount of 0.5 mol to 150 mol per one mol of the at least one silane compound.

14. The method as claimed in claim 13, wherein the at least one silane compound of formula (1) to (4) is hydrolyzed and condensed in the presence of water in an amount of 0.5 mol to 130 mol per one mol of the at least one silane compound.

15. The method as claimed in claim 8, wherein the substrate is a semiconductor device, a multilaminated printed wiring board, a liquid crystal display element or an electroluminescent display element.

16. The method as claimed in claim 8, wherein the substrate is a silicon wafer.

* * * * *